United States Patent
Liu et al.

(10) Patent No.: US 8,939,722 B2
(45) Date of Patent: Jan. 27, 2015

(54) MOUNTING DEVICE FOR FAN

(75) Inventors: Lei Liu, Shenzhen (CN); Wei-Dong Cong, Shenzhen (CN)

(73) Assignee: ScienBiziP Consulting (Shenzhen) Co., Ltd., Guangdong (CN)

( * ) Notice: Subject to any disclaimer, the term of this patent is extended or adjusted under 35 U.S.C. 154(b) by 519 days.

(21) Appl. No.: 13/316,463

(22) Filed: Dec. 10, 2011

(65) Prior Publication Data

US 2013/0142642 A1 Jun. 6, 2013

(30) Foreign Application Priority Data

Dec. 6, 2011 (CN) .......................... 2011 1 0400595

(51) Int. Cl.
*F01D 25/28* (2006.01)
(52) U.S. Cl.
USPC ..................................... 415/213.1; 415/214.1
(58) Field of Classification Search
CPC ...... F28F 13/00; F04D 29/646; F04D 19/002; F04D 25/08
USPC ................ 415/213.1, 214.1; 361/695; 211/26
See application file for complete search history.

(56) References Cited

U.S. PATENT DOCUMENTS

| 6,839,233 B2 * | 1/2005 | Cravens et al. ............... 361/695 |
| 2009/0034191 A1 * | 2/2009 | Yin .............................. 361/695 |
| 2009/0257192 A1 * | 10/2009 | Li .................................. 361/695 |
| 2010/0025017 A1 * | 2/2010 | Zhang et al. ............. 165/104.31 |
| 2012/0162915 A1 * | 6/2012 | Gong et al. ................... 361/695 |
| 2012/0163971 A1 * | 6/2012 | Chiu et al. ................. 415/213.1 |

* cited by examiner

*Primary Examiner* — Edward Look
*Assistant Examiner* — Danielle M Christensen
(74) *Attorney, Agent, or Firm* — Novak Druce Connolly Bove + Quigg LLP

(57) ABSTRACT

A mounting device for mounting a number of fans includes a rack and a number of fixing members. The rack includes a bottom wall and two sidewalls perpendicularly extending up from opposite sides of the rack. Each sidewall defines a number of vents spaced along the lengthwise of the sidewall. Each fixing member includes a board perpendicularly mounted to the bottom wall and positioned at a side of two aligning vents, and a blocking member mounted to the board and slidable along the lengthwise of the sidewalls to block a top of a fan.

8 Claims, 5 Drawing Sheets

MOUNTING DEVICE FOR FAN

BACKGROUND

1. Technical Field

The present disclosure relates to a device for mounting a plurality of fans.

2. Description of Related Art

Many electronic devices use fans to cool electronic components. A fan is ordinarily mounted in the electronic device by a plurality of screws, which makes it difficult and time-consuming to replace or remove the fan for repair.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
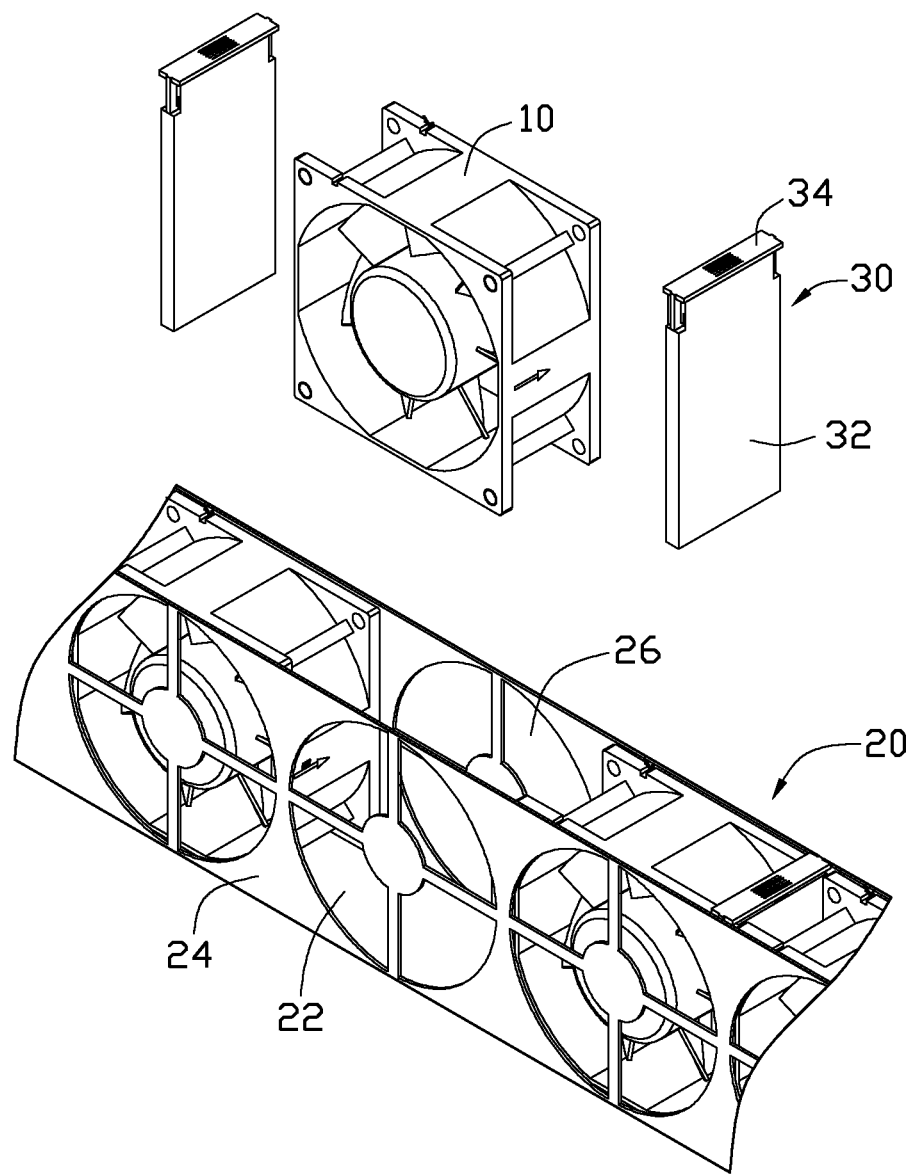
FIG. 1 is an exploded, isometric view of an exemplary embodiment of a mounting device and fans, wherein the mounting device includes a plurality of fixing members.
Figure 2:
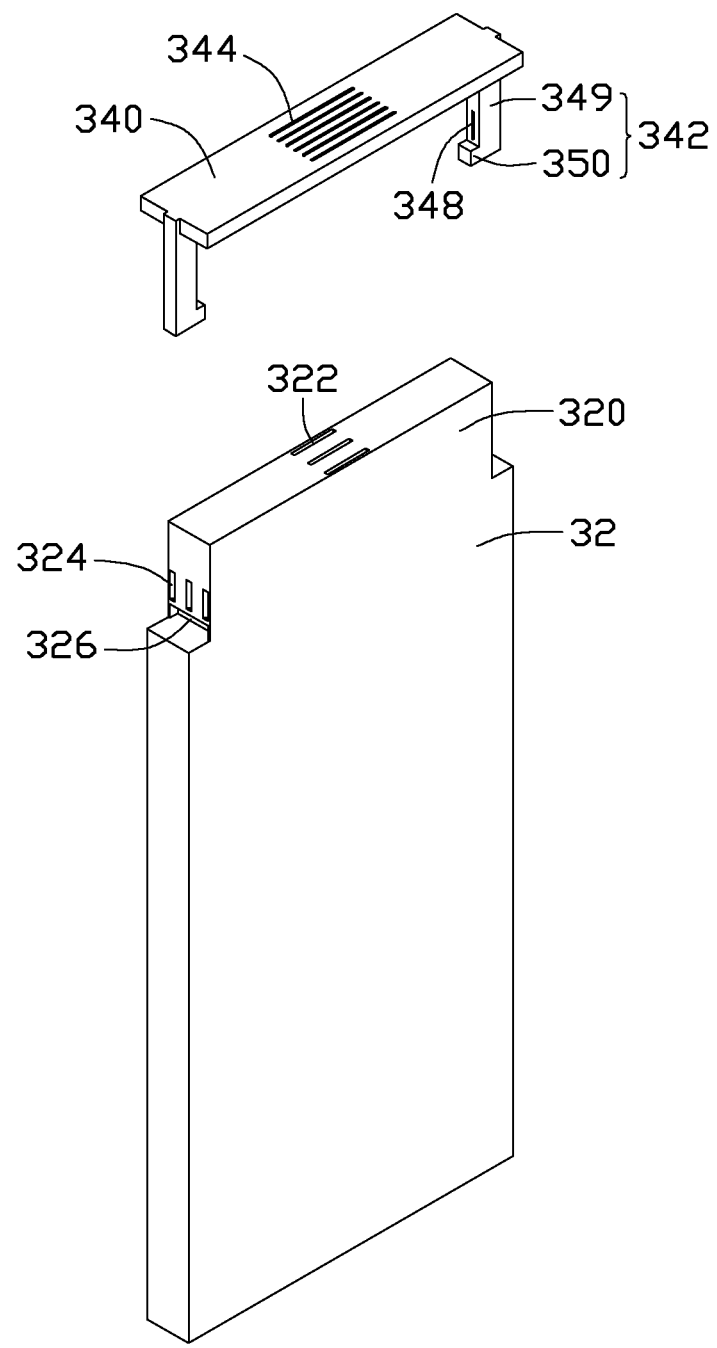
FIG. 2 is an exploded, enlarged view of one of the fixing members of FIG. 1.
Figure 3:
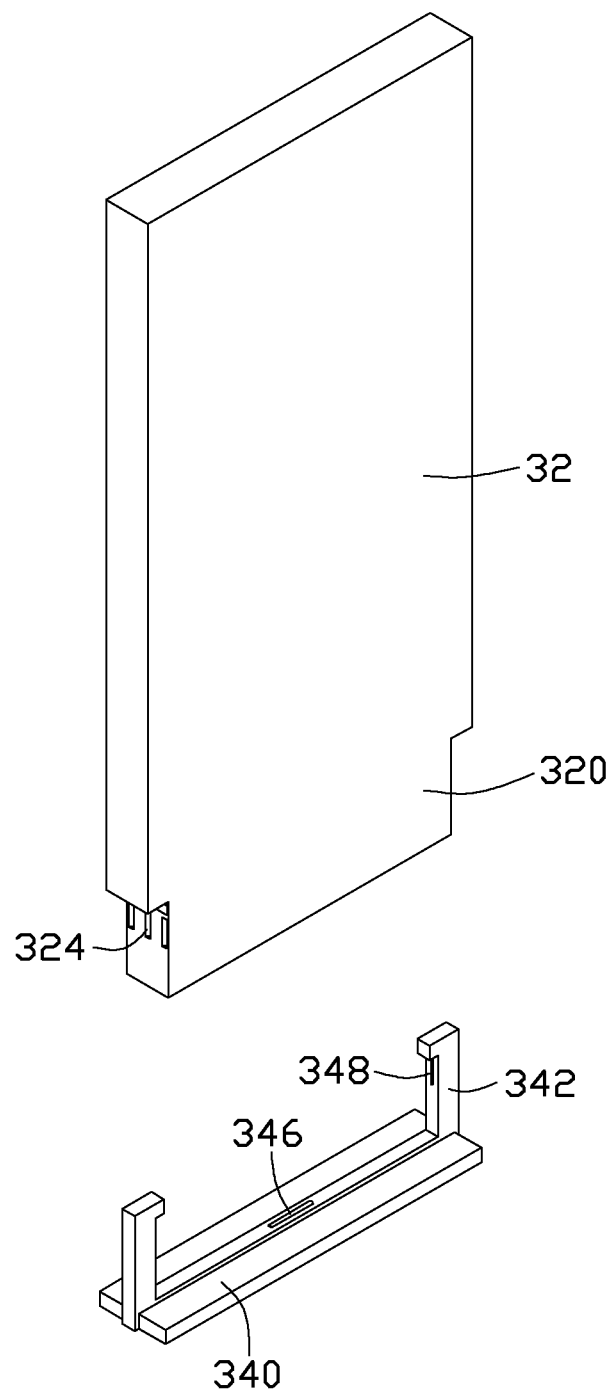
FIG. 3 is an inverted view of the fixing member of FIG. 2.

Referring to FIGS. 1, 2, and 3, an exemplary embodiment of a mounting device for mounting a plurality of fans 10 includes a rack 20 and a plurality of fixing members 30.

The rack 20 includes a bottom wall 22, two sidewalls 24 perpendicularly extending up from opposite sides of the bottom wall 22, and two end walls (not shown) perpendicularly extending up from opposite ends of the bottom wall 22. Each sidewall 24 defines a plurality of vents 26.

Each fixing member 30 includes a board 32 and a locking member 34 slidably mounted to a top of the board 32.

The board 32 forms a rectangular block 320 on a first end of the board 32. The block 320 defines three parallel first slots 322 in a top surface, and three second slots 324 in each of two opposite end surfaces of the block 320. A slide slot 326 is defined in each end surface below the corresponding second slots 324.

The locking member 34 includes a plate 340 and two hooks 342 respectively extending down from opposite ends of the plate 340. An antiskid portion 344 is formed on a top surface of the plate 340, for conveniently operating the locking member 34. A first engaging portion 346 protrudes from a bottom surface of the plate 340. Each hook 342 includes a leg 349 perpendicularly extending down from the plate 340 and a protrusion 350 perpendicularly extending from a bottom end of the leg 349 toward the other hook 342. A second engaging portion 348 protrudes from an inner surface of each hook 342, facing the other hook 342.

In assembly of each of the fixing members 30, the legs 349 of the fixing member 30 are deformed away from each other to sandwich the block 320. The protrusions 350 face the corresponding slide slots 326. The legs 349 are released to be restored. The protrusions 350 are slidably engaged in the corresponding slide slots 326 along a direction parallel to the end surfaces of the block 320. The first engaging portion 346 is engaged in the central first slot 322. The second engaging portions 348 are engaged in the corresponding central second slots 324.

In assembly of the mounting device, a second end of each fixing member 30 opposite to the block 320 is supported to the bottom wall 22, at a side of two aligning vents 26 of the sidewalls 24.

Figure 4:
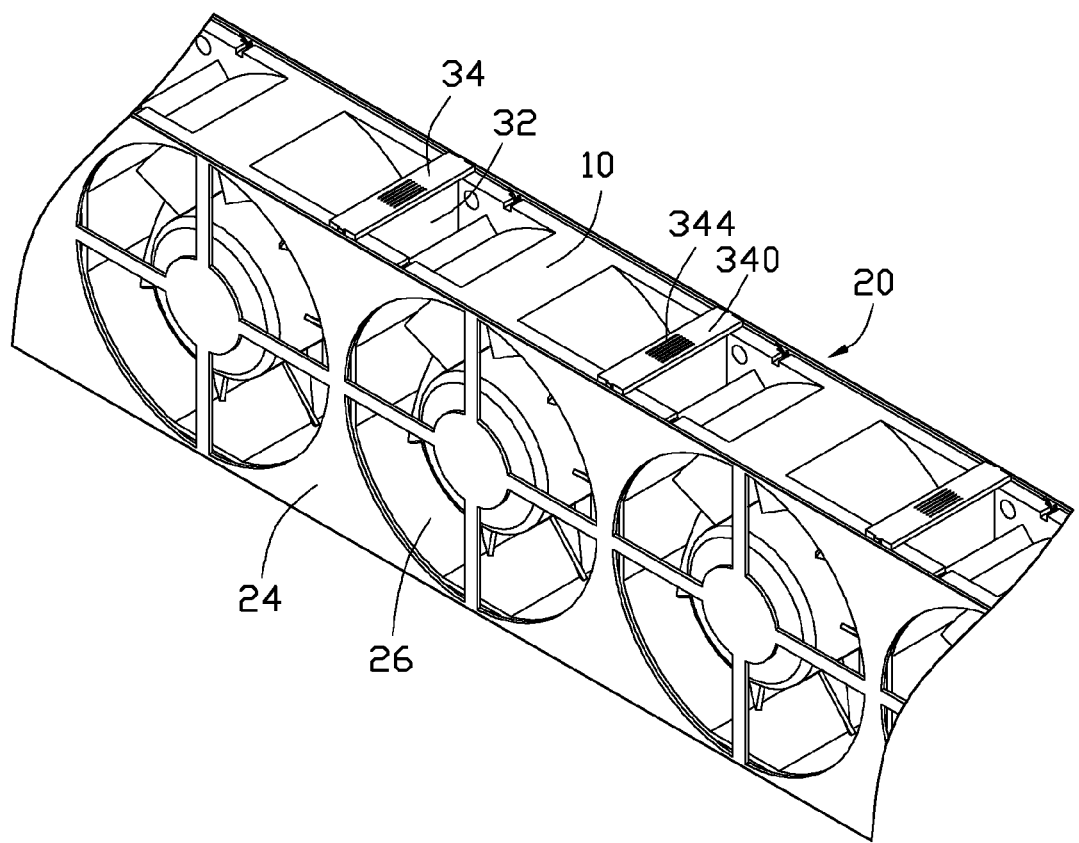
FIG. 4 is an assembled view of FIG. 1.
Figure 5:
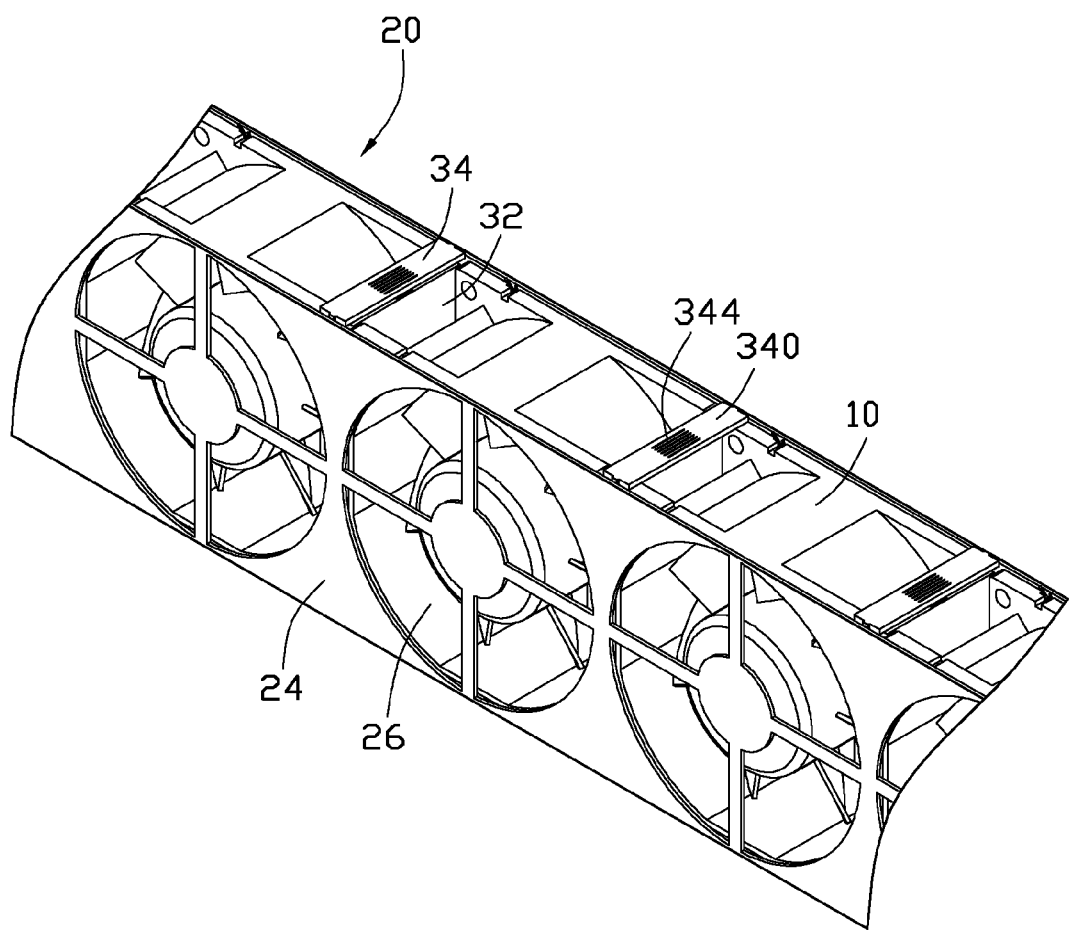
FIG. 5 is similar to FIG. 4, but shows a state of use.

Referring to FIG. 4, in use, two adjacent locking members 34 at opposite sides of two aligning vents 26 of the sidewalls 24 are slid away from each other in the corresponding slide slots 326. The first and second engaging portions 346 and 348 of each locking member 34 are engaged in the outmost first and second slots 322 and 324 of the corresponding fixing member 30. A fan 10 is then received in the rack 20 between the two locking members 34, aligning with the corresponding vents 26 of the sidewalls 24. The locking members 34 are then slid back toward each other, until the first and second engaging portions 346 and 348 are engaged in the corresponding central first and second slots 322 and 324. Therefore, the plates 340 abut a top of the fan 10 to block the top of the fan 10. Each plate 340 can block tops of two adjacent fans 10 at opposite sides of the plate 340.

In uninstalling each fan 10, two adjacent locking members 34 at opposite sides of the fan 10 are slid away from each other, thereby the plates 340 releasing the fan 10. The fan 10 can be easily removed out of the rack 20.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A mounting device for mounting a plurality of fans, comprising:

a rack comprising a bottom wall and two sidewalls extending up from opposite sides of the bottom wall, each sidewall defining a plurality of vents corresponding to the fans, the plurality of vents in one of the sidewalls respectively aligning the plurality of vents in the other; and a plurality of fixing members each comprising a board mounted between the sidewalls and positioned at a side of two aligning vents of the sidewalls, and a locking member movably mounted to the board between a first position where the locking member is away from the aligning vents and a second position where the locking member abuts a top of the fan aligning with the aligning vents to block the top of the fan, and wherein each board forms a block on a top, the block define three parallel first slots in a top surface, each locking member comprises a plate forming a first engaging portion in a bottom surface, to be selectively engaged in one of the first slots, thereby positioning the locking member in either the first position or the second position.

2. The mounting device of claim 1, wherein each block further defines three parallel second slots in each of opposite end surfaces, each locking member further comprises two hooks extending down from opposite ends of the plate, each hook comprises a leg perpendicular to the plate and a second engaging portion protrudes from an inner surface of the leg facing the other hook, to be selectively engaged in one of the second slots of a corresponding one of the end surfaces, thereby positioning the locking member in either the first position or the second position.

3. The mounting device of claim 2, wherein a slide slot is defined in each end surface of the block below the corresponding second slots, a protrusion extends from a bottom end of each leg toward the other hook, to be slidably engaged in a corresponding one of the slide slots.

4. The mounting device of claim 1, wherein an antiskid portion is formed on a top surface of the plate.

5. A fan assembly, comprising:
- a rack comprising a bottom wall and two sidewalls extending up from opposite sides of the bottom wall, each sidewall defining a vent;
- a fan supported on the bottom wall and sandwiched between the sidewalls, the fan aligning with the vents of the sidewalls; and
- a fixing member comprising a board mounted between the sidewalls and positioned at a side of the fan, and a locking member movably mounted to the board, wherein the locking member is operable to move between a first position where the locking member is away from the fan and a second position where the locking member abuts a top of the fan to block the top of the fan, and
- wherein the board forms a block on a top, the block defines two parallel first slots in a top surface, the locking member comprises a plate forming a first engaging portion in a bottom surface, to be selectively engaged in one of the first slots, thereby positioning the locking member in the first or second position.

6. The fan assembly of claim 5, wherein the block further defines two parallel second slots in each of opposite end surfaces, the locking member further comprises two hooks extending down from opposite ends of the plate, each hook comprises a leg perpendicular to the plate and a second engaging portion protrudes from an inner surface of the leg facing the other hook, to be selectively engaged in one of the second slots of the corresponding end surface, thereby positioning the locking member in the first or second position.

7. The fan assembly of claim 6, wherein a slide slot is defined in each end surface of the block below the corresponding second slots, a protrusion extends from a bottom end of each leg toward the other hook, to be slidably engaged in a corresponding one of the slide slots.

8. The fan assembly of claim 5, wherein an antiskid portion is formed on a top surface of the plate.

\* \* \* \* \*